(12) United States Patent
Chataigner

(10) Patent No.: US 10,361,657 B2
(45) Date of Patent: Jul. 23, 2019

(54) SERIES OF COUPLED SYNCHRONOUS OSCILLATORS

(71) Applicant: STMicroelectronics SA, Montrouge (FR)

(72) Inventor: Emmanuel Chataigner, Montbonnot Saint Martin (FR)

(73) Assignee: STMicroelectronics SA, Montrouge (FR)

( * ) Notice: Subject to any disclaimer, the term of this patent is extended or adjusted under 35 U.S.C. 154(b) by 201 days.

(21) Appl. No.: 15/358,350

(22) Filed: Nov. 22, 2016

(65) Prior Publication Data

US 2017/0346443 A1 Nov. 30, 2017

(30) Foreign Application Priority Data

May 30, 2016 (FR) ...................................... 16 54845

(51) Int. Cl.
*H03B 5/12* (2006.01)

(52) U.S. Cl.
CPC ......... *H03B 5/1231* (2013.01); *H03B 5/1215* (2013.01); *H03B 5/1253* (2013.01); *H03B 5/1296* (2013.01); *H03B 2200/0076* (2013.01)

(58) Field of Classification Search
CPC ... H01L 2224/48091; H01L 2924/1305; H01L 2924/00; H01L 2924/00014; H01L 2924/13091; H03L 7/00; H03L 5/00; H03L 7/081; H03B 2200/0074; H03B 5/1852; H03B 5/364; H03B 27/00; H03B 5/36; H03B 5/1231; H03B 5/1296; H03B 5/1215; H03B 5/1253; H03B 2200/0076; H03K 3/03; H03K 3/86; H03K 3/0315
USPC ...................................... 331/46, 2, 55, 45, 57
See application file for complete search history.

(56) References Cited

U.S. PATENT DOCUMENTS

| 7,161,438 | B2 * | 1/2007 | Wood ........................ G06F 1/10 331/45 |
| 2013/0099870 | A1 * | 4/2013 | Terrovitis ............. H03B 5/1841 331/56 |
| 2014/0070898 | A1 | 3/2014 | Shirinfar et al. |

FOREIGN PATENT DOCUMENTS

EP 2961062 A2 12/2015

OTHER PUBLICATIONS

Chang HC et al, "Phase Noise in Coupled Oscillators: Theory and Experiment", IEEE Transactions on Microwave Theory and Techniques, 1997, pp. 604-615.

(Continued)

*Primary Examiner* — Arnold M Kinkead
(74) *Attorney, Agent, or Firm* — Crowe & Dunlevy

(57) ABSTRACT

An integrated circuit includes at least two identical, synchronous and independent oscillator circuits that are coupled one to one in parallel with each other at homologous oscillating nodes of the respective oscillator circuits. The coupling in parallel is made using at least one coupling track that is configured so as to not introduce any phase shift or to introduce a very small phase shift.

24 Claims, 4 Drawing Sheets

(56) References Cited

OTHER PUBLICATIONS

INPI Search Report and Written Opinion for FR 1654845 dated Mar. 27, 2017 (8 pages).
Yahya M Tousi et al: "A Novel CMOS High Power Terahertz VCO Based on Coupled Oscillators: Theory and Implementation," IEEE Journal of Solid-State Circuits, IEEE Service Center Piscataway NJ USA, vol. 47, No. 12, Dec. 31, 2012 pp. 3032-3042, 1st Sentence of Chapter III, Terahertz Harmonic VCO, Figs. 8, 13.
Balasubramaniyan A et al: "An Eight Mesfet Periodic Spatial Power Combiner," IEEE MTS International Microwave Symposium Digest, Atlanta, Jun. 14-18, 1993, vol. 2, Jun. 14, 1993, pp. 611-614, Fig 6.

\* cited by examiner

SERIES OF COUPLED SYNCHRONOUS OSCILLATORS

PRIORITY CLAIM

This application claims the priority benefit of French Application for Patent No. 1654845, filed on May 30, 2016, the disclosure of which is hereby incorporated by reference.

TECHNICAL FIELD

Embodiments relate to integrated circuits, and, more particularly, to ultra-low phase noise LC oscillators, the phase noise thereof being, for example, less than −105 dBc/Hz with a frequency shift of 1 MHz for a carrier at 85 GHz.

BACKGROUND

Oscillators, which are generally voltage controlled but may be current controlled, are commonly used in modern electronic circuits, for example in frequency synthesizers, in order to deliver regular signals over time to a computer or to a data stream. Inductor-capacitor (LC) oscillators are of sinusoidal type and usually include an oscillating circuit comprising a coil and a capacitor. The oscillating circuit sets the oscillation frequency and stores the energy of the oscillations.

Phase noise is an important parameter of frequency synthesizers and oscillators and represents the random fluctuations in the phase of a waveform.

In ultra-high-speed data transfer technologies it is particularly advantageous for the phase noise of the oscillators to be extremely low, especially for millimeter wavelengths. Millimeter wavelengths are, for example, used in telecommunications systems such as ultra-high-speed data backhaul networks, in automotive radar or else in medical or military radar.

Currently, integrated on-silicon technologies do not meet the needs of the latest generation of backhaul networks, and low phase noise LC oscillators are usually produced using III-V semiconductor technologies such as those based on gallium arsenide GaAs.

However, III-V-semiconductor-based technologies are more expensive and provide less in the way of functionality compared to silicon-based technologies.

In general, phase noise usually decreases logarithmically with the increase in the energy held within the resonant circuit; more specifically, increasing the energy by a factor N decreases the phase noise by 10×log 10(N).

However, to increase power to decrease phase noise requires larger transistors, which imply more parasitic capacitance and therefore smaller frequency ranges, and therefore a lower inductance, and therefore a lower quality factor and therefore an increase in phase noise.

This iteration reaches a limit when it is physically impossible to decrease the inductance any further, and the phase noise is improved at the expense of the extent of the range of frequencies, which is no longer enough to cover the range set by the telecommunications standard.

An experiment carried out on phase noise in MESFET (GaAs) oscillators coupled, in a non-integrated manner, by transmission lines (Chang, et al., "Phase Noise in Coupled Oscillators: Theory and Experiment", IEEE Transactions on Microwave Theory and Techniques, 1997, pp. 604-615, incorporated by reference) was carried out and demonstrated that coupling between multiple oscillators may allow their powers to be combined and hence phase noise to be decreased on condition that these oscillators are coupled in a reciprocal and bilateral manner.

Problems with this "macroscopic" experiment, i.e. one not carried out on an integrated circuit, include, in particular, frequency correspondence between coupled oscillators, phase shift tuning, or phase noise that is sensitive to synchronization.

On the other hand, United States Patent Application Publication No. 2013/0099870 (incorporated by reference) describes a system of coupled resonant circuits allowing a low phase noise to be obtained. However, the coupling connections are formed through sharing the tracks of the inductive elements (coils) of two complementary resonant circuits in contact.

In this configuration, certain circuits, for example the circuits located at the edge of the system, do not have the same resonant frequency as the others. Moreover, the components and power supply lines are placed within the coils, which is known to be detrimental to the performance of the system.

Thus, it would be advantageous to make use of the logarithmic improvement in phase noise obtained by increasing the energy held, without having to modify the structure of a functional oscillator circuit.

SUMMARY

In this regard, the integrated circuit proposed according to a first aspect comprises a series of at least two substantially identical, synchronous and independent oscillator circuits that are coupled one to one in parallel at homologous oscillating nodes of the respective oscillating circuits, via at least one coupling track.

Substantially identical oscillator circuits are oscillator circuits that are identical within the limits of differences due to fabrication method or geometric orientation.

Synchronous oscillator circuits are oscillator circuits tuned to one and the same oscillation frequency, and preferably in phase.

Independent oscillator circuits are oscillator circuits capable of operating per se, in particular without needing to be mutually coupled.

For example, such substantially identical, synchronous and independent oscillator circuits may advantageously be coupled via coupling tracks in order to minimize the phase noise of each thereof.

A parasitic capacitance between the substrate and these tracks appears in parallel with the oscillating circuits, it is consequently advantageous to decrease the value of this parasitic substrate capacitance to the greatest possible extent.

The coupling track is thus advantageously configured not to introduce any phase shift, or at the very least to limit potential phase shift to the greatest possible extent, for example to a value of less than or equal 18 degrees, preferably zero.

In this regard, the length of said at least one coupling track may be less than or equal to one twentieth of the corresponding wavelength at the frequency of oscillation of the oscillator circuits.

Thus, a series of oscillators is advantageously coupled to decrease the phase noise of each oscillator without requiring the supply voltages and/or the currents present in the oscillators to be increased.

On the other hand, as the oscillators are synchronous, practically no current flows through the coupling tracks and thus coupling introduces very little or no interference to the oscillating circuit, apart from the parasitic substrate capacitance of these tracks which slightly lowers the oscillation frequency but does not change the behavior of the oscillators and of the coupling.

The impedance of said at least one coupling track may also advantageously be less than one tenth of the impedance of an oscillator circuit.

Stated otherwise, said connections introduce very little, or even no, phase shift, and require no tuning, unlike magnetic couplings or couplings made via ordinary coupling devices.

According to one embodiment, the coupling tracks are distinct from the tracks of the oscillator circuits, and each of the oscillator circuits may advantageously comprise an individual output.

Thus, each oscillator operates conventionally as an isolated oscillator, while benefiting from synchronous coupling to the series of oscillators.

The performance of the integrated circuit can moreover easily be deduced and sized from the performance of an independent oscillator.

Specifically, the performance of an independent oscillator, such as its range of operating frequencies or startup time, remains unchanged in these embodiments, and the phase noise is reduced for each of the oscillators of the series.

Advantageously, in particular in terms of production costs, the integrated circuit is produced on a silicon substrate.

Thus, this embodiment is compatible with existing oscillators and associated on-silicon production methods.

The oscillator circuits may be of resonator type, comprising a coil and a capacitor.

According to one advantageous embodiment, the structure of each of the oscillator circuits of the series is identical and configured so that a given number of juxtaposed oscillator circuits, forming a group, fits, advantageously exactly, around a point shared by each oscillator of said group, referred to as a "node point", in the manner of a mosaic with repeated patterns, and in which the oscillator circuits are coupled one to one to said node point.

This embodiment around a node point allows the reciprocal and bilateral coupling condition, required to obtain the decrease in phase noise, to be provided. Likewise, grouping multiple node points around one node point again allows reciprocal and bilateral coupling to be provided.

The integrated circuit may comprise at least two groups of juxtaposed oscillator circuits, in which said homologous oscillating nodes of the oscillator circuits of each group are connected one to one via metal transmission lines.

These embodiments are particularly advantageous in terms of the time and cost required to produce such an integrated circuit. Specifically, the various oscillator circuits are formed in the same manner in common steps.

The series of oscillator circuits may comprise, for example, between 2 and 32 oscillator circuits, depending on the desired application.

According to one embodiment, each oscillator is, for example, configured to oscillate at a frequency of between 57 GHz and 86 GHz.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF THE DRAWINGS

Figure 1:
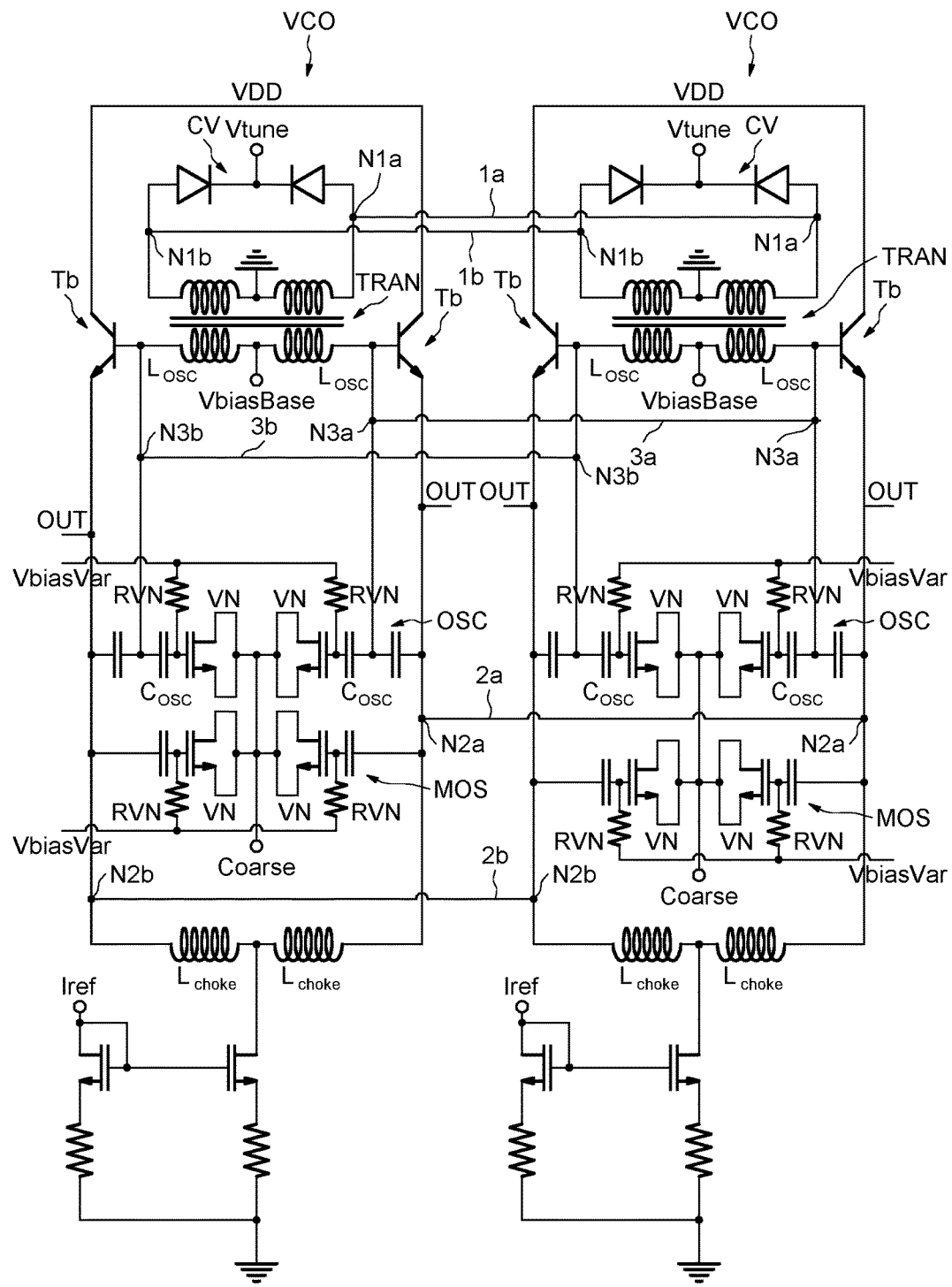
FIG. 1 is a circuit diagram of an exemplary electronic ultra-low phase noise oscillator circuit.

FIG. 1 shows a circuit diagram of an exemplary electronic ultra-low phase noise oscillator circuit according to one embodiment, comprising a series of two substantially identical voltage-controlled oscillator circuits VCO.

The resonant wavelength of the oscillators VCO is, for example, in the millimeter range.

These VCO oscillators comprise a resonant circuit OSC comprising an inductive element LOSC biased at a midpoint by a voltage VbiasBase. The terminals of the inductive element LOSC are connected to the bases of two bipolar transistors Tb that transmit, to their emitters, an amplified signal of the oscillations across the terminals of the inductive element LOSC. The collectors of the two bipolar transistors Tb are connected to the supply voltage VDD and the low impedance of their emitters allows them to isolate the oscillating signal from external variations that could otherwise be applied to the output terminals OUT.

Furthermore, the resonant circuit OSC comprises capacitive elements COSC in parallel with the inductive elements LOSC and that are connected to a pair of NMOS varactors VN that are biased so as to be depleted or enhanced, allowing two different frequency bands to be attained.

The varactors are biased, on the one hand, at a voltage VbiasVar via the resistors RVN and, on the other hand, by a signal Coarse.

Another, similar pair of varactors VN is controlled by the same signals. These varactors are connected between the emitters of the transistors Tb and terminals of a choke Lchoke.

The choke Lchoke allows variations in a bias current of the oscillator circuit VCO, delivered by a current mirror regulated by a reference current Iref, to be attenuated.

A capacitor connected between the emitter and the base of the transistor Tb in feedback allows a fraction of the output voltage OUT to be injected into the base of the transistor Tb, thus allowing the oscillations to be initiated and sustained.

A transformer TRAN comprises, in the conventional manner, two interlinked coils forming a primary circuit and a secondary circuit, the coil of the primary circuit being the coil LOSC of the resonant circuit OSC.

The secondary circuit of the transformer TRAN comprises an inductive element that is ground biased at its midpoint and coupled to the inductive element LOSC.

Elements CV with variable capacitance, typically PN junction diodes, comprising a control terminal Vtune, are coupled to the resonant circuit OSC via the transformer TRAN, allowing the voltage Vtune to be controlled independently of the voltage VbiasBase.

Wires $1a$, $1b$ represent, respectively, a connection between oscillating nodes N1$a$ and a connection between nodes N1$b$ of each oscillator circuit VCO. The impedance of the connections $1a$, $1b$ is negligible compared to the impedance of the resonant circuit and they may be considered to be short circuits. The impedance of the resonant circuit is, for example, of the order of a few hundred ohms, and the impedance of the connections 1a and 1b is, for example, lower than or equal to a few tens of ohms.

The oscillating nodes N1a are each located at one and the same position in the respective oscillator circuits VCO, and are thus referred to as being homologous; the same applies to the oscillating nodes N1b.

In this embodiment, the homologous oscillating nodes are located in the voltage control stage CV.

As a variant, the homologous oscillating nodes may be located, for example, on the outputs OUT of the respective oscillating circuits VCO, and the connections between the oscillating nodes N2a and N2b of each circuit VCO are then represented by the wires 2a and 2b.

As another variant, the homologous oscillating nodes may be located, for example, at the terminals of the primary circuit of the transformer TRAN of the respective oscillating circuits VCO, and the connections between the oscillating nodes N3a and N3b of each circuit VCO are then represented by the wires 3a and 3b.

More generally, the homologous oscillating nodes are located in a similar position in the respective oscillator circuits VCO, and carry the oscillating signal delivered by the resonant circuits OSC.

This type of independent oscillator VCO assembly, described here without limitation, provides a high level of performance, especially in terms of phase noise and frequency range, but of course this is applicable to any other type of LC-resonator-based oscillator circuit.

Stated otherwise, a series of two oscillator circuits VCO has been coupled via parallel connections to homologous oscillating nodes, allowing the phase noise of each of the oscillators to be decreased, while moreover being able to operate completely independently as if there were no coupling between them.

Figure 2:
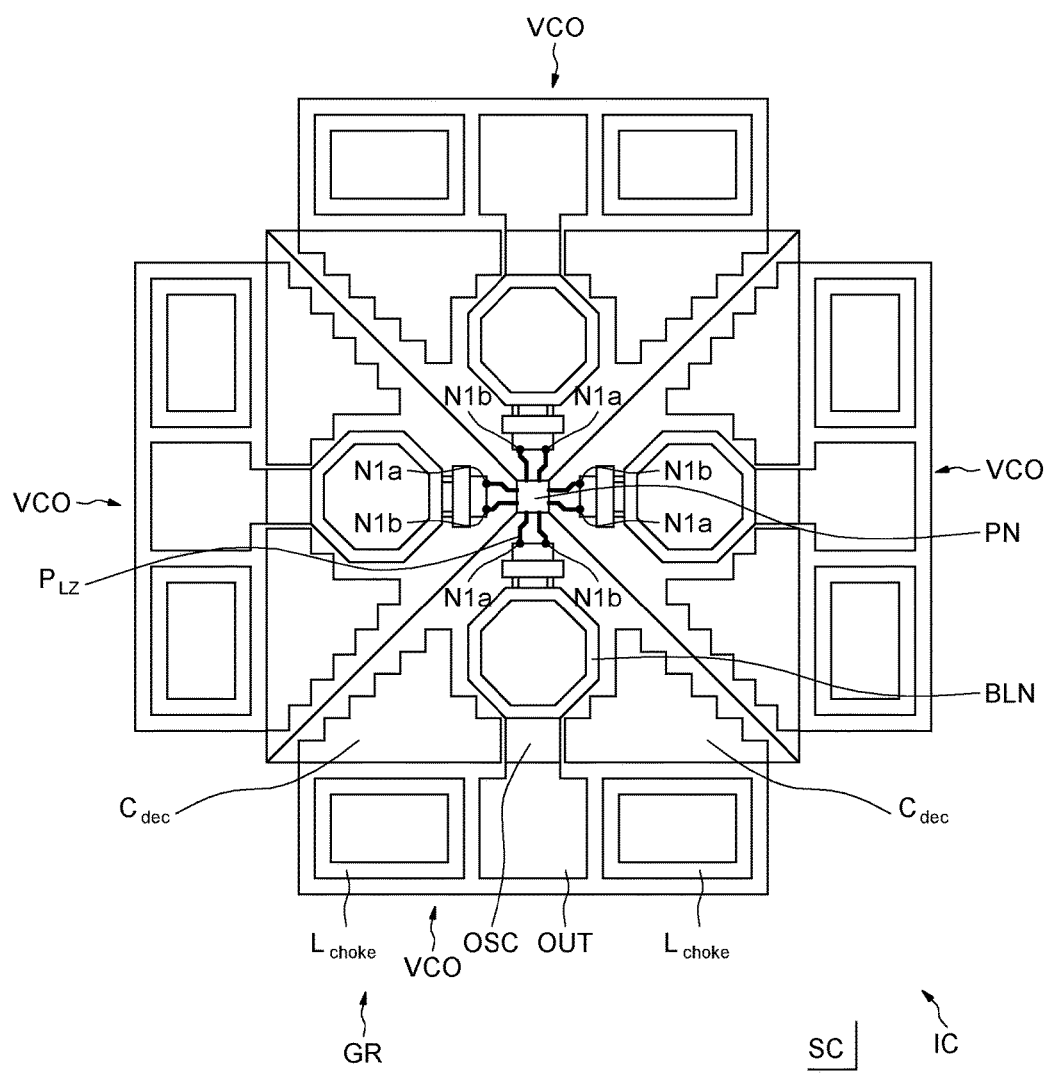
FIG. 2 schematically shows an integrated circuit architecture.

FIG. 2 schematically shows an advantageous integrated circuit architecture.

This representation corresponds to a top view of an integrated circuit IC formed in and on a semiconductor substrate SC, advantageously made of silicon, and, for example, in BiCMOS (bipolar and CMOS) technology.

By way of indication, the area of such a structure is of the order of 1 mm by 1 mm, and the various components are in this instance shown substantially to scale.

This architecture comprises a group GR of four voltage-controlled oscillators VCO which are substantially identical to one another and correspond to the oscillator circuits VCO of FIG. 1.

Each oscillator VCO takes the form of an isosceles triangle combined with a rectangle along its base. Thus, the four oscillators of the group GR are juxtaposed along their isometric sides so as to fit together precisely, forming a substantially square structure.

Each oscillator VCO comprises a resonant circuit OSC, whose coil LOSC is interlinked with a coil of the voltage control stage in the transformer TRAN.

For example, bipolar transistors and varactors are positioned in a stage, referred to as an output stage OUTP, located between two chokes Lchoke.

Power supply decoupling capacitors Cdec, commonly used and not shown in FIG. 1, are positioned on either side of the resonant circuit OSC and of the transformer TRAN so as to occupy the area not occupied by the oscillators themselves.

The architecture shown corresponds to the embodiment of FIG. 1 in which the homologous oscillating nodes are located in the voltage control stage CV, with reference to the connections 1a and 1b and to the nodes N1a and N1b.

These connections 1a and 1b are made by coupling tracks PLZ of small length, for example of less than about a hundred micrometers.

The length of the coupling tracks PLZ is more generally less than or equal to one twentieth of the corresponding wavelength of the frequency of oscillation of an oscillator VCO, said wavelength potentially being in the millimeter range.

When considering the length of the coupling tracks, the propagation characteristics of said coupling tracks may be taken into account. Such a length is usually referred to by the term electrical length.

The coupling tracks PLZ are connected to one another at a point located at the intersection of the four oscillator VCO structures of the group GR, which point is referred to as a node point PN, and comprises co-located apex points of the isosceles triangular layout shapes for the oscillators.

The node point PN comprises, for example, sections of metal track to which the respective metal tracks PLZ are connected together.

Thus, in this embodiment, referred to as being of centroid type, the length of the metal tracks PLZ is minimized, allowing losses to be minimized and parasitic capacitance with the substrate SC to be limited.

Furthermore, in this embodiment, the connections 1a, 1b formed by the metal tracks PLZ may be considered to be short circuits, i.e. connections whose impedance is negligible compared to the impedance of an oscillator circuit VCO, or, more specifically, less than 10% of the latter.

Consequently, the connections 1a, 1b formed by the metal tracks PLZ introduce very little or even no phase shift between the oscillating signals delivered by each oscillator circuit VCO thus coupled, which therefore operate synchronously without requiring additional tuning.

Figure 3:
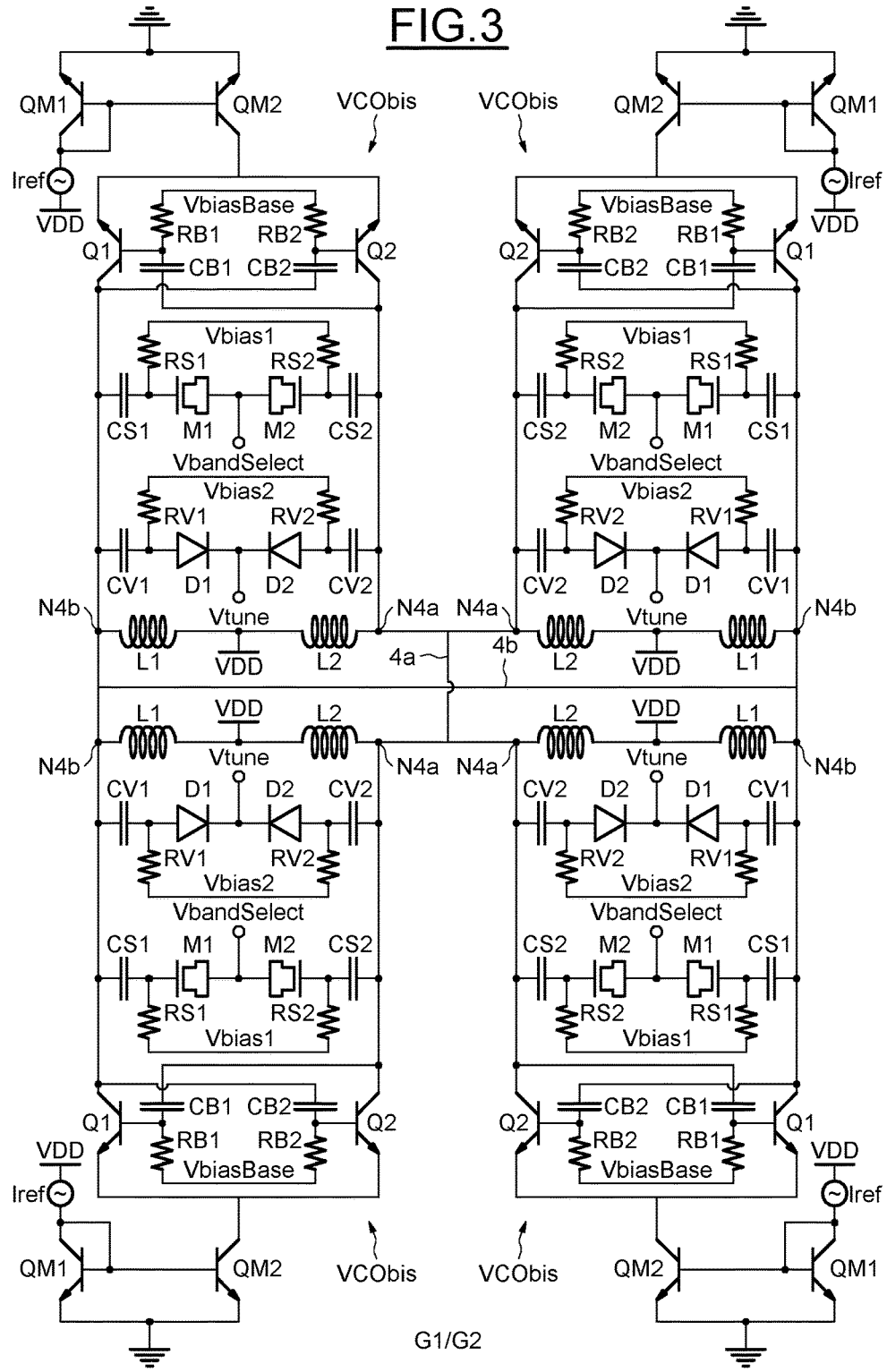
FIG. 3 is a circuit diagram of another exemplary ultra-low phase noise oscillator electronic circuit.

FIG. 3 shows a circuit diagram of another exemplary ultra-low phase noise oscillator electronic circuit, comprising a series of four substantially identical oscillator circuits VCObis.

One oscillator circuit VCObis is described below.

An inductive element L1-L2, supplied with a voltage VDD at a midpoint allows an oscillating signal to be generated across its terminals, which are connected to bipolar transistors Q1, Q2 via their collectors.

The bipolar transistors Q1, Q2 allow the oscillations to be sustained by presenting a negative resistance to the circuit composed of all of the passive inductive and capacitive elements that are located on the collector side of said transistors.

Other bipolar transistors QM1, QM2 form a current mirror, and a current generator Iref regulates the bias current of the oscillator circuit, by means of this current mirror, which bias current is applied to a node connecting the emitters of the transistors Q1, Q2.

A capacitive bridge comprising capacitive elements CB1, CB2 that are connected between the base of each of the transistors Q1, Q2 and the collector of the other, respectively, allows, with the base capacitances of said transistors Q1, Q2, the amplitude of the oscillations on said bases to be limited.

The bases of the transistors Q1, Q2 are moreover biased via resistors RB1, RB2 to a base potential Vbiasbase.

Varactors formed by MOS transistors M1/M2 are connected via their gates to the collectors of the respective transistors Q1, Q2, via respective capacitive decoupling elements CS1, CS2. The varactors M1/M2 are biased so as to be depleted, or enhanced, on the one hand via the resistors RS1, RS2 by a voltage Vbias1 on their gate and, on the other hand, by a voltage VbandSelect, and allow two different frequency bands to be attained.

Capacitive element CS1, CS2 allow the voltage on the gates of the transistors M1, M2 to be decoupled from the rest of the oscillator circuit.

PN junction diodes D1, D2 that are connected via their anode to the collector of the respective transistors Q1, Q2, and via their cathode to a voltage terminal Vtune, are reverse biased and allow fine and continuous tuning of the frequency within a given frequency band. On the one hand, the anodes of the diodes D1, D2 are biased, via the resistors RV1, RV2, to a voltage Vbias2 and, on the other hand, their cathodes are biased to a voltage Vtune.

Capacitive elements CV1, CV2 that are connected between the anodes of the respective diodes D1, D2 and the collectors of the respective transistors Q1, Q2 allow the voltage on the anodes of the diodes D1, D2 to be decoupled from the rest of the oscillator.

Figure 4:
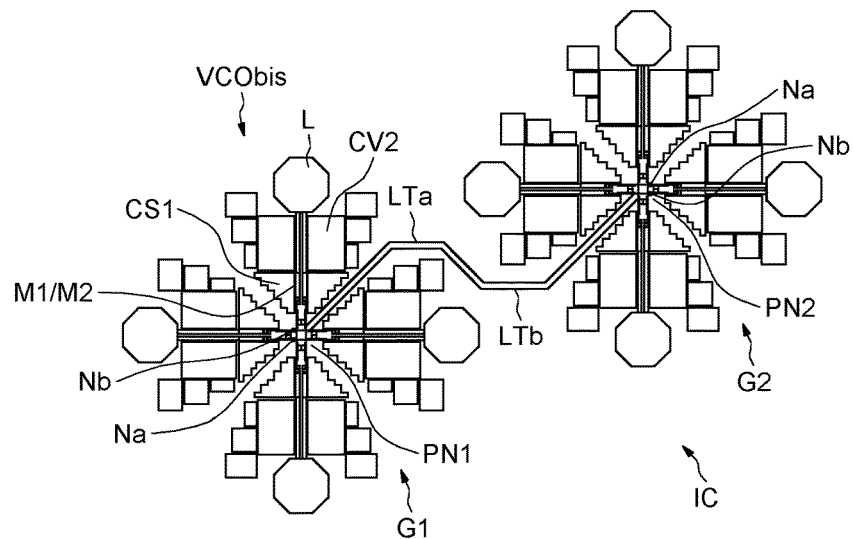
FIG. 4 schematically shows another oscillator architecture.

Furthermore, the four oscillator circuits VCObis are coupled one to one in parallel at homologous oscillating nodes N4a and N4b, which are located at the terminals of the inductive element L1-L2 of each oscillator circuit VCObis, via wires, respectively 4a and 4b. FIG. 4 schematically shows another advantageous oscillator architecture, comprising a series of eight voltage-controlled oscillator circuits VCObis that are distributed in a first group G1 and a second group G2 of four oscillators each.

Each group G1 and G2 corresponds to the configuration shown in FIG. 3, some references, such as the coil L, capacitive decoupling elements CV2 and CV1 and the varactors M1, M2, from the oscillating circuit of FIG. 3 having been inserted into FIG. 4.

In each of the groups G1 and G2, the oscillator circuits VCObis are coupled one to one in parallel at homologous oscillating nodes Na and Nb of each oscillator circuit VCObis, for example corresponding to the nodes N4a and N4b of the circuit shown in FIG. 3.

Each of the first and second groups G1 and G2 is also in a centroid-type configuration of four oscillators VCObis. Each group G1 and G2 therefore also includes a node point, denoted by PN1 and PN2, respectively, to which homologous oscillating nodes Na, Nb of the oscillating circuits of the respective group are coupled one to one via short circuit-type connections.

Furthermore, the first node point PN1 of the first group G1 and the second node point PN2 of the second G2 are connected via metal transmission lines LTa, LTb.

More specifically, the oscillating nodes Na of the oscillators VCObis of the first group G1 that are connected to one another are connected to the homologous oscillating nodes Na of the oscillators VCObis of the second group G2 via a transmission line LTa. Likewise, the oscillating nodes Nb of the oscillators VCObis of the first group G1 that are connected to one another are connected to the homologous oscillating nodes Nb of the oscillators VCObis of the second group G2 via a transmission line LTb.

The metal transmission lines LTa, LTb thus also make it possible to couple together the oscillator circuits VCObis of the first group G1 and the oscillator circuits VCObis of the second group G2 in parallel.

The oscillators VCO, VCObis are subject to a phase noise that gets weaker as the number of oscillator circuits coupled in parallel is increased, while proving robust to variations in supply voltage.

Figure 5:
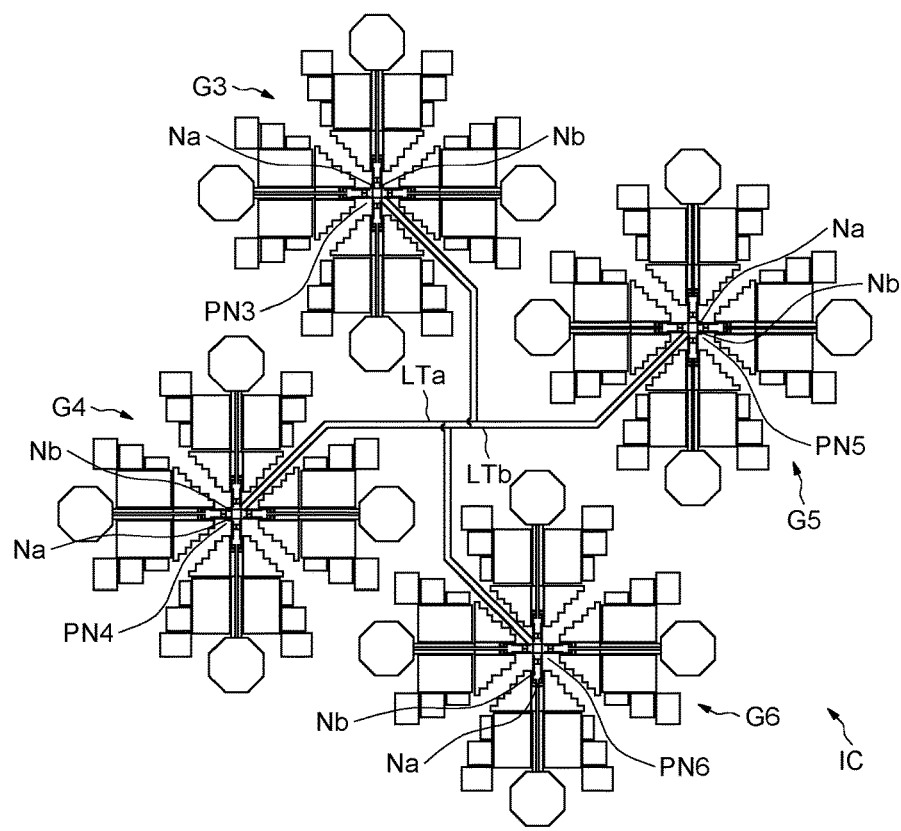
FIG. 5 schematically shows another oscillator architecture.

FIG. 5 schematically shows another oscillator architecture according to the invention, comprising four groups G3, G4, G5 and G6 of four oscillators VCObis each, similar to the groups shown in relation to FIG. 3.

In a manner analogous to the embodiment presented in relation to FIG. 3, the node points PN3, PN4, PN5 and PN6 of the respective groups are connected one to one via metal transmission lines LTa, LTb.

By way of indication, the embodiments described above may operate at a supply voltage VDD of 1.8 V for a power of 150 mW to 200 mW, and exhibit a phase noise of between −100 dBc/Hz and −115 dBc/Hz with a frequency shift of 1 MHz for a carrier frequency of 85 GHz.

Of course, the invention is not limited to the embodiments disclosed above, but rather encompasses all variants; the invention may, for example, be applied to current-controlled oscillators, employ any type of transistor (CMOS, bipolar, MESFET, etc.) or else be applied to other semiconductor technologies (GaAs, InGaAs, etc.).

What is claimed is:

1. An integrated circuit, comprising:
   a series of at least two substantially identical, synchronous and independent oscillator circuits;
   wherein said at least two substantially identical, synchronous and independent oscillator circuits of said series are coupled one to one in parallel at homologous oscillating nodes of the respective substantially identical, synchronous and independent oscillator circuits using at least one coupling track;
   wherein a length of said at least one coupling track is less than or equal to one twentieth of a corresponding wavelength at a frequency of oscillation of the at least two substantially identical, synchronous and independent oscillator circuits.

2. An integrated circuit, comprising:
   a series of at least two substantially identical, synchronous and independent oscillator circuits;
   wherein said at least two substantially identical, synchronous and independent oscillator circuits of said series are coupled one to one in parallel at homologous oscillating nodes of the respective substantially identical, synchronous and independent oscillator circuits using at least one coupling track;
   wherein an impedance of said at least one coupling track is less than one tenth of an impedance of one of said at least two substantially identical, synchronous and independent oscillator circuits.

3. The integrated circuit according to claim 1, wherein said at least one coupling track is distinct from tracks of each of said at least two substantially identical, synchronous and independent oscillator circuits.

4. The integrated circuit according to claim 1, wherein each of said at least two substantially identical, synchronous and independent oscillator circuits comprises an individual output.

5. The integrated circuit according to claim 1, produced on a silicon substrate.

6. The integrated circuit according to claim 1, wherein a structure of each of the substantially identical, synchronous and independent oscillator circuits is identical and is configured so that a given number of juxtaposed oscillator circuits, forming a group, fits around a node point shared by each oscillator circuit of said group, in a mosaic with repeated patterns, and wherein each of the substantially identical, synchronous and independent oscillator circuits is coupled one to one to said node point.

7. The integrated circuit according to claim 6, further comprising at least two groups of juxtaposed oscillator circuits, wherein said homologous oscillating nodes of the oscillator circuits of each group are coupled one to one via respective metal transmission lines.

8. An integrated circuit, comprising:
a series of at least two substantially identical, synchronous and independent oscillator circuits;
wherein said at least two substantially identical, synchronous and independent oscillator circuits in said series are coupled one to one in parallel at homologous oscillating nodes of the respective substantially identical, synchronous and independent oscillator circuits using at least one coupling track;
wherein a structure of each substantially identical, synchronous and independent oscillator circuits is identical and is configured so that a given number of juxtaposed oscillator circuits, forming a group, fits around a node point shared by each oscillator circuit of said group, in a mosaic with repeated patterns, and wherein the oscillator circuits are coupled one to one to said node point; and
wherein each oscillator circuit in said group has a circuit layout having an isosceles triangular shape and wherein node point is a co-located apex point of the isosceles triangular shapes.

9. The integrated circuit according to claim 1, wherein said series of at least two substantially identical, synchronous and independent oscillator circuits comprises between 2 and 32 oscillator circuits.

10. An integrated circuit, comprising:
a series of at least two substantially identical, synchronous and independent oscillator circuits;
wherein said at least two substantially identical, synchronous and independent oscillator circuits in said series are coupled one to one in parallel at homologous oscillating nodes of the substantially identical, synchronous and independent oscillator circuits using at least one coupling track;
wherein each substantially identical, synchronous and independent oscillator circuit is configured to oscillate at a frequency of between 57 GHz and 86 GHz.

11. An integrated circuit, comprising:
a first oscillator circuit including a first pair of oscillating signal nodes;
a second oscillator circuit including a second pair of oscillating signal nodes;
wherein the first and second oscillator circuit are substantially identical, synchronous and independent oscillator circuits;
wherein each of the first and second oscillating circuits has a circuit layout having an isosceles triangular shape, each isosceles triangular shape having a pair of isometric sides, and wherein one isometric side of the first oscillating circuit is adjacent and parallel to one isometric side of the second oscillating circuit; and
a pair of coupling tracks that directly connect corresponding oscillating signal nodes of the first and second oscillator circuits such that the first and second oscillator circuits are connected in parallel with each other.

12. The integrated circuit of claim 11, wherein the pair of coupling tracks are provided for connection of first and second oscillating circuits at co-located apex points of the isosceles triangular shapes for the first and second oscillating circuits.

13. An integrated circuit, comprising:
a first oscillator circuit including a first pair of oscillating signal nodes;
a second oscillator circuit including a second pair of oscillating signal nodes;
wherein the first and second oscillator circuits are substantially identical, synchronous and independent oscillator circuits;
a pair of coupling tracks that directly connect corresponding oscillating signal nodes of the first and second oscillator circuits such that the first and second oscillator circuits are connected in parallel with each other; and
wherein a length of each track in said pair of coupling tracks is less than or equal to one twentieth of a corresponding wavelength at a frequency of oscillation of the first and second oscillator circuits.

14. An integrated circuit, comprising:
a first oscillator circuit including a first pair of oscillating signal nodes;
a second oscillator circuit including a second pair of oscillating signal nodes;
wherein the first and second oscillator circuits are substantially identical, synchronous and independent oscillator circuits;
a pair of coupling tracks that directly connect corresponding oscillating signal nodes of the first and second oscillator circuits such that the first and second oscillator circuits are connected in parallel with each other; and
wherein an impedance of each track of said pair of coupling tracks is less than one tenth of an impedance of one of said first and second oscillator circuits.

15. An integrated circuit, comprising:
a first oscillator circuit including a first pair of oscillating signal nodes;
a second oscillator circuit including a second pair of oscillating signal nodes;
wherein the first and second oscillator circuits are substantially identical, synchronous and independent oscillator circuits;
a pair of coupling tracks that directly connect corresponding oscillating signal nodes of the first and second oscillator circuits such that the first and second oscillator circuits are connected in parallel with each other; and
wherein each oscillating circuit of the first and second oscillating circuits has a circuit layout having an isosceles triangular shape, each isosceles triangular shape having a pair of isometric sides, and wherein the pair of coupling tracks are provided for connection of first and second oscillating circuits at co-located apex points of the isosceles triangular shapes for the first and second oscillating circuits.

16. The integrated circuit according to claim 2, wherein said at least one coupling track is distinct from tracks of each of said at least two substantially identical, synchronous and independent oscillator circuits.

17. The integrated circuit according to claim 2, wherein each of said substantially identical, synchronous and independent oscillator circuits comprises an individual output.

18. The integrated circuit according to claim 2, produced on a silicon substrate.

19. The integrated circuit according to claim 8, wherein said at least one coupling track is distinct from tracks of each of said substantially identical, synchronous and independent oscillator circuits.

20. The integrated circuit according to claim 8, wherein each of said substantially identical, synchronous and independent oscillator circuits comprises an individual output.

21. The integrated circuit according to claim 8, produced on a silicon substrate.

22. The integrated circuit according to claim 10, wherein said at least one coupling track is distinct from tracks of each of said substantially identical, synchronous and independent oscillator circuits.

23. The integrated circuit according to claim 10, wherein each of said substantially identical, synchronous and independent oscillator circuits comprises an individual output.

24. The integrated circuit according to claim 10, produced on a silicon substrate.

* * * * *